United States Patent

Terakado et al.

[11] Patent Number: 5,192,018
[45] Date of Patent: Mar. 9, 1993

[54] WIRE BONDING METHOD

[75] Inventors: Yoshimitsu Terakado; Nobuto Yamazaki, both of Tokyo, Japan

[73] Assignee: Kabushiki Kaisha Shinkawa, Tokyo, Japan

[21] Appl. No.: 842,257

[22] Filed: Feb. 27, 1992

[30] Foreign Application Priority Data

Feb. 27, 1991 [JP] Japan ................................ 3-53700

[51] Int. Cl.$^5$ .............................................. B23K 31/02
[52] U.S. Cl. .................................... 228/179; 228/4.5
[58] Field of Search ....................... 228/4.5, 179, 173.5

[56] References Cited

U.S. PATENT DOCUMENTS

| | | | |
|---|---|---|---|
| 4,327,860 | 5/1982 | Kirshenboin et al. | 228/4.5 |
| 4,445,633 | 5/1984 | Bonham, Jr. | 228/4.5 |
| 4,932,584 | 6/1990 | Yamazaki et al. | 228/179 |

FOREIGN PATENT DOCUMENTS 57-87143  5/1982  Japan.
63-42135  2/1988  Japan.

Primary Examiner—Richard K. Seidel
Assistant Examiner—Jeffrey T. Knapp
Attorney, Agent, or Firm—Koda and Androlia

[57] ABSTRACT

In a wire bonding method in which a capillary is raised from a first bonding point after bonding and then moved in a direction opposite to a second bonding point, thus making a reverse action, such a reverse action is made in a circular-arc shape around a neck part of the wire at the first bonding point. Thus, an ideal wire-looping is accomplished, thus preventing wire damage which could be caused by reverse actions.

3 Claims, 1 Drawing Sheet

WIRE BONDING METHOD

BACKGROUND OF THE INVENTION

1. Field of the Invention

The present invention relates to a wire bonding method that connects a first bonding point and a second bonding point with a wire, and more particularly, to a wire looping method used in wire bonding.

2. Prior Art

In wire bonding, it is preferable to keep the shape of wire loop constant during the bonding process. In the currently employed method, a capillary is raised after the wire is connected to a first bonding point, and then a reverse action is performed so that the capillary is moved horizontally by a small amount away from the second bonding point. These movements are performed with a clamp, which holds the wire, kept open. The Japanese Patent Application Publication ("Kokai") Nos. 57-87143 and 63-42135 disclose these methods.

In these prior art, the reverse action is an action of wire moving away from the second bonding point, forming a wire loop between the first and second bonding points.

In this reverse action, the capillary moves horizontally. This action of the capillary, however, drags the wire, and a force greater than the force required to deform the wire is applied to the wire. This causes a damage to the neck part of the wire which is a part of the wire at the first bonding point.

SUMMARY OF THE INVENTION

Accordingly, the object of the present invention is to provide a wire bonding method which makes it possible to deform the wire in an ideal shape and perform wire-looping with a reverse action that causes no damage to the wire.

The method of the present invention that accomplishes the object is characterized in that when a capillary is raised and a subsequent reverse action is performed after the wire is bonded to first bonding point, such a reverse action is made by a circular-arc movement of the capillary around the wire neck portion at the first bonding point or at a point near the wire neck portion.

Since the reverse action is a circular-arc action, an ideal wire-loop is formed, and the capillary does not drag any portion of the wire or damage the wire.

DETAILED DESCRIPTION OF THE INVENTION

Figure 1:
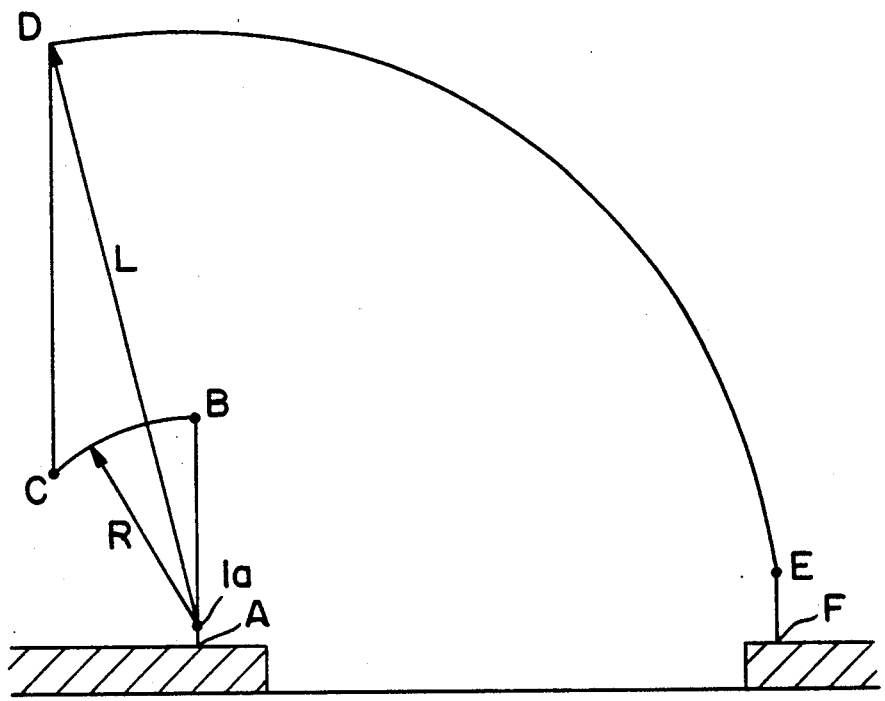
FIG. 1 is an explanatory diagram showing the path the capillary moves according to one embodiment of the present invention.
Figure 2:
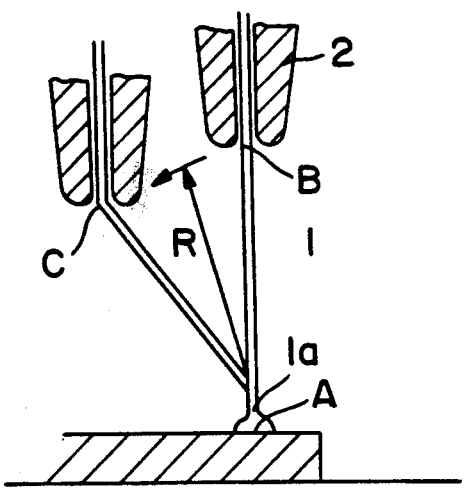
FIG. 2 is an explanatory diagram showing the essential section of the present invention.

One embodiment of the present invention will be described below with reference to FIGS. 1 and 2.

With a clamp which holds a wire 1 open, a capillary 2 is raised to point B after the wire 1 is connected to first bonding point A. After being stopped temporarily (or for only an instant) at point B, the capillary 2 is caused to make a reverse action, i.e., a circular-arc action with a radius of R centered at the wire neck portion 1a or at a point close to the wire neck portion 1a, and then moved to point C.

Thus, since the reverse action is a circular-arc action (caused by the capillary) which is centered at the wire neck portion 1a or at a point near the wire neck portion 1a, the capillary 2 does not drag the wire 1 at all. As a result, except for the force necessary to deform the wire 1, no other force is applied to the wire 1. Accordingly, wire looping can be performed smoothly without damaging the wire 1.

After the completion of the reverse action, the capillary 2 is raised from point C to point D. In other words, the capillary 2 is moved the distance required to form a wire loop, and the wire 1 is fed out. Afterward, the clamp is closed, and the capillary 2 is moved to point E, which is above the second bonding point F making a circular-arc movement with a radius of L centered at the wire neck portion 1a or on a point near the wire neck portion 1a. The capillary 2 is then lowered to the second bonding point F, and bonding is performed thereto. The movement of the capillary 2 from point C to the second bonding point F can be the same movement as that taken in the prior art.

As described above, since the reverse action performed in the present invention is a circular-arc action, the capillary does not drag the wire. Thus, there is no damage to the wire, and an ideal wire loop is formed.

We claim:

1. A wire bonding method comprising the ordered steps of:

bonding an end of a bonding wire to a first bonding point;

unclamping said bonding wire;

raising a capillary to a first predetermined point above said first bonding point;

stopping said capillary temporarily at said first predetermined point;

moving said capillary through a circular arc of a constant radius in a direction opposite to that of a second bonding point to a second predetermined point;

raising said capillary to a third predetermined point above said second predetermined point a distance sufficient to form a bonding wire loop;

clamping said bonding wire;

moving said capillary through another circular arc of another constant radius to a forth predetermined point above said second bonding point;

lowering said capillary to said second bonding point; and bonding said bonding wire to said second bonding point.

2. A bonding method according to claim 1 wherein said constant radius equals a distance from said first bonding point to said first predetermined point.

3. A bonding method according to claim 2 wherein said another constant radius is equal to a distance between said first bonding point and said third predetermined point.

* * * * *